US007774174B2

(12) United States Patent
Sheehan (10) Patent No.: US 7,774,174 B2
(45) Date of Patent: Aug. 10, 2010

(54) BRANCH MERGE REDUCTION OF RLCM NETWORKS

(75) Inventor: Bernard N. Sheehan, St. Paul, MN (US)

(73) Assignee: Mentor Graphics Corporation, Wilsonville, OR (US)

( * ) Notice: Subject to any disclaimer, the term of this patent is extended or adjusted under 35 U.S.C. 154(b) by 560 days.

(21) Appl. No.: 11/102,596

(22) Filed: Apr. 7, 2005

(65) Prior Publication Data

US 2006/0031055 A1   Feb. 9, 2006

Related U.S. Application Data

(60) Provisional application No. 60/560,432, filed on Apr. 7, 2004.

(51) Int. Cl.
*G06F 17/50* (2006.01)
(52) U.S. Cl. ............................... 703/2; 703/14; 703/19; 716/1; 716/4; 716/6
(58) Field of Classification Search ................ 703/1, 703/2, 14, 19; 716/1, 4, 6
See application file for complete search history.

(56) References Cited

U.S. PATENT DOCUMENTS

| 6,308,304 | B1* | 10/2001 | Devgan et al. ................. 716/5 |
| 6,460,165 | B1* | 10/2002 | Ismail et al. ................... 716/1 |
| 6,662,149 | B1* | 12/2003 | Devgan et al. ................ 703/14 |
| 6,671,862 | B1* | 12/2003 | Seward ........................... 716/5 |
| 6,687,658 | B1* |  2/2004 | Roychowdhury ............... 703/2 |
| 6,763,504 | B2* |  7/2004 | Rao et al. ...................... 716/4 |
| 6,789,237 | B1* |  9/2004 | Ismail ............................. 716/4 |
| 7,124,388 | B2* | 10/2006 | Wang ........................... 716/10 |
| 7,243,313 | B1* |  7/2007 | Qin et al. ........................ 716/2 |
| 7,251,791 | B2* |  7/2007 | Wang ............................. 716/1 |
| 2001/0029601 | A1* | 10/2001 | Kimura et al. ................ 716/19 |
| 2004/0049746 | A1* |  3/2004 | Rao et al. ...................... 716/4 |
| 2004/0225981 | A1* | 11/2004 | Cocchini ........................ 716/9 |
| 2004/0257207 | A1* | 12/2004 | Elassaad et al. .......... 340/425.1 |
| 2005/0021319 | A1* |  1/2005 | Li et al. .......................... 703/2 |
| 2005/0096888 | A1* |  5/2005 | Ismail ............................. 703/2 |
| 2005/0160387 | A1* |  7/2005 | Wang ............................. 716/4 |
| 2006/0100830 | A1* |  5/2006 | Lee et al. ........................ 703/2 |

OTHER PUBLICATIONS

C. s. Amin, M. H. Chowdhury, Y. I. Ismail, Realizable RLCK Circiut Crunching, DAC 2003.*
P. J. H. Elias, N. P. van der Meijs, Extracting Circuit Models for Large RC Interconnections that are Accurate up to a Predefined Signal Frequency, 1996 ACM.*

(Continued)

*Primary Examiner*—Kamini S Shah
*Assistant Examiner*—Kibrom Gebresilassie
(74) *Attorney, Agent, or Firm*—Banner & Witcoff, Ltd.

(57) ABSTRACT

Various tools and techniques are provided for reducing an original circuit network into a simpler, realizable RCLM circuit network. Branches of the original network are merged to reduce its total number of nodes. More particularly, the branches of the original circuit are merged so that the resulting reduced circuit approximately replicates the timing characteristics of the original circuit over the desired operating frequency range. The determination whether to merge two branches is made based upon one or more circuit characteristics associated with the node connecting the branches.

9 Claims, 8 Drawing Sheets

OTHER PUBLICATIONS

A. Devgan, P. R. O'Brien, Realizable Reduction for RC Interconnect Circuits, 1999 IEEE.*

B. N. Sheehan, "Branch Merge Reduction of RLCM Networks," ICCAD 2003, Nov. 11-13, 2003.*

C. S. Amin, M. h. Chowdhury, Y. I. Ismail, "Realizable RLCK Circuit Crunching" DAC 2003.*

L. Rohrer and L. Pillage, "Asymptotic Waveform Evaluation for Timing Analysis" IEEE TCAD, 1990, pp. 352-366, vol. 9.

P. Feldman and R.W. Freund, "Efficient Linear Circuit Analysis bu Pade Approximation via the Lanczos Process," Euro-DAC 1994, pp. 170-175.

M. Silveira, M. Kamon, I. Elfadel and J. White, "A Coordinate-Transformed Arnoldi Algorithm for Generating Guaranteed Stable Reduced-Order Models for RLC Circuits," DAC 1996, pp. 288-294.

K. Kerns, I. Wemple, A. Yang, "Stable and Efficient Reduction of substrate Model Networks Using Congruence Transforms," ICCAD 1995, pp. 207-214.

A. Odabasioglu, M. Celik, L. Pileggi, "PRIMA: Passive Reduced-order Interconnect Macromodelinig Algorithm," DAC 1997, pp. 5565.

A. Van Genderen and N. Van Der Meijs, "Extracting Simple but Accurate RC models for VSLI Interconnect," Proc. IEEE Symp. Circuits and Systems, 1988, pp. 2351-2354.

P. Vanoostende, P. Six and H. De Man, "DARSI : RC Data Reduction ," IEEE TCAD, 1991, pp. 493-500, vol. 10.

P. Elias and N. Van Der Meijs, "Extracting Circuit Models for Large RC Interconnections that are Accurate up to a predefined Signal Frequency," DAC 1996, pp. 764-769.

B. Sheehan, "TICER: Realizable Reduction of Extracted RC Circuits ," ICCAD 1999, pp. 200-203.

B. Sheehan, "ENOR: Model Order Reduction of RLC Circuits Using Nodal Equations for Efficient Factorization," DAC, 1999.

H. Zheng and L. Pileggi, "Robust and Passive Model Order Reduction for Circuits Containing Susceptance Elements," ICCAD 1002, pp. 761-766, 2002.

Z. Qin, C.K. Cheng, "Realizable parasitic reduction using generalized Y-Δ transformation," DAC 2003, pp. 220-225.

C. Amin, M. Chowdhury, Y. Ismail, "Realizable RLCK circuit crunching," DAC 2003, pp. 226-231.

A. Deutsch, et al. 'On-Chip Wiring Design Challenges for Gigahertz Operation, Proc. IEEE, Apr. 2001, pp. 529-555, vol. 89 No. 4.

* cited by examiner

BRANCH MERGE REDUCTION OF RLCM NETWORKS

This application is a continuation-in-part application of provisional U.S. Application No. 60/560,432, filed Apr. 7, 2004, entitled "Branch Merge Reduction Of RCLM Networks" and naming Bernard N. Sheehan as inventor, which provisional patent application is incorporated entirely herein by reference.

FIELD OF THE INVENTION

The invention is directed toward modeling the operation of a complex circuit. Various embodiments of the invention are particularly suited toward reducing the number of nodes in a complex circuit to form a more simple circuit that still approximately replicates the operation of the original complex circuit.

BACKGROUND OF THE INVENTION

Microcircuit devices have become commonly used in a variety of products, from automobiles to microwaves to personal computers. As the importance of these devices grows, manufacturers continue to improve these devices. Each year, for example, microcircuit device manufacturers develop new techniques that allow microcircuit devices, such as programmable microprocessors, to be more complex and yet still smaller in size.

As microcircuit devices become more complex, they also become more difficult to design and test. A conventional microcircuit device, for example, may have many millions of connections, and each connection may cause the microcircuit to operate incorrectly or even fail if the connection is not properly designated. Not only must the connections be properly designated, but the time required for each circuit structure to process or transmit a signal must fall within a desired time constraint. If a circuit structure, such as a transistor gate, takes too long to process a signal, then another circuit structure may not receive the signal in time to operate properly. Similarly, if a circuit structure, such as a wiring line, takes too long to transmit a signal, then another circuit structure may not receive the signal in time to perform its intended task.

Accordingly, when designing or testing a microcircuit, it is often important to consider the timing characteristics of various structures in the circuit. Final timing verification of a circuit design is normally performed using extracted parasitics. In order to be efficient, these timing verification techniques require compact circuit interconnect models. As a result, model order reduction of RC and RCLM networks has been a vigorous area of research during the last decade. Reduction of RC and RCLM networks using moment matching techniques, such as asymptotic waveform evaluation, has been a dominant theme. An example of this technique is discussed in "Asymptotic Waveform Evaluation For Timing Analysis," by L. Rohrer and L. Pillage, IEEE TCAD, Vol. 9, pp. 352-366, 1990.

Other model order reduction techniques are described in "Efficient Linear Circuit Analysis by Pade Approximation via the Lanezos Process," by P. Feldmann and R. W. Freund, Euro-DAC 1994, pp. 170-75, "A Coordinate-Transformed Arnoldi Algorithm for Generating Guaranteed Stable Reduced-Order Models of RLC Circuits," by M. Silveira, M. Kamon, I. Elfadel and J. White, DAC 1996, pp. 288-94, and "Stable and Efficient Reduction of substrate Model Networks Using Congruence Transforms," by K. Kerns, I. Wemple. A. Yang, ICCAD 1995, pp. 207-14. These techniques improve numerical conditioning, while the congruence transformations solve stability problems. The culmination in this evolution is Krylov subspace projection methods like PRMA, which is described in "PRIMA: Passive Reduced-order Interconnect Macromodeling Algorithm," by A. Odabasioglu, M. Celik, L. Pileggi, DAC 1997, pp. 5865.

A different approach to analyzing the timing characteristics of a circuit design, however, employs a realizable circuit rather than an abstract model. With these analysis techniques, the realizable circuit is created by abridging the original circuit. The smaller realizable circuit is created from local circuit transformations on the original circuit, by which some nodes or branches of the original circuit are eliminated or modified, and other nodes or branches may be introduced. While the resulting circuit is simpler than the original circuit, it will approximately replicate certain behaviors of the original circuit. Thus, the timing of the reduced circuit can be analyzed instead of the original circuit, and more efficiently.

Various approaches to this method are described in, for example, "Extracting Simple but Accurate RC models for VLSI Interconnect," by A. van Genderen and N. van der Meijs, Proc. IEEE Symp. Circuits and Systems, 1988, pp. 2351-54, "DARSI: RC Data Reduction," by P. Vanoostende, P. Six, and H. De Man, IEEE TCAD, vol. 10, 1991, pp. 493-500, "Extracting Circuit Models for Large RC Interconnections that are Accurate up to a Predefined Signal Frequency," by P. Elias and N. van der Meijs, DAC 1996, pp. 764-69, "TICER: Realizable Reduction of Extracted RC Circuits," by B. Sheehan, ICCAD 1999, pp. 200-03, and B. Sheehan, "ENOR: Model Order Reduction of RLC Circuits Using Nodal Equations for Efficient Factorization," DAC 1999.

BRIEF SUMMARY OF THE INVENTION

Various embodiments of the invention provide tools and techniques for reducing an original circuit network into a simpler, realizable RCLM circuit network. With these embodiments of the invention, branches of the original network are merged to reduce its total number of nodes. More particularly, the branches of the original circuit are merged so that the resulting reduced circuit approximately replicates the timing characteristics of the original circuit over the desired operating frequency range. With various embodiments of the invention, the determination whether to merge two branches is made based upon one or more characteristics associated with the node joining the branches. If these circuit characteristics do not comply with specified criteria threshold values, then the resulting branch will not replicate the timing characteristics of the original circuit with sufficient accuracy, and the original branches are not merged.

As will be appreciated by those of ordinary skill in the art, a realizable reduced circuit network that may be created according various embodiments of the invention provides several advantages over the circuit model projection methods employed by conventional timing verification techniques. For example, realizable reduced circuit network can be efficiently analyzed. Relying as they do on strictly local circuit transformations, realizable reduced circuit networks can be produced 'on the fly' during scan-line extraction of parasitics from a circuit design being verified. Moreover, the techniques provided by various embodiments of the invention can process circuits with many ports.

With conventional projection methods, however, the subspace size grows with port count. Still further, realizable reduced circuit networks produced according to various embodiments of the invention provide engineer-friendly circuit descriptions as output. Conventional projection methods, by contrast, manufacture matrices that may have poles and residues, but which do not include resistors, capacitors, and inductors. Thus, realizable reduced circuit networks are particularly desirable for use with extraction tools that must generate SPICE or SPEF files of RLCM components.

DETAILED DESCRIPTION OF THE INVENTION

Operating Environment

Figure 1:
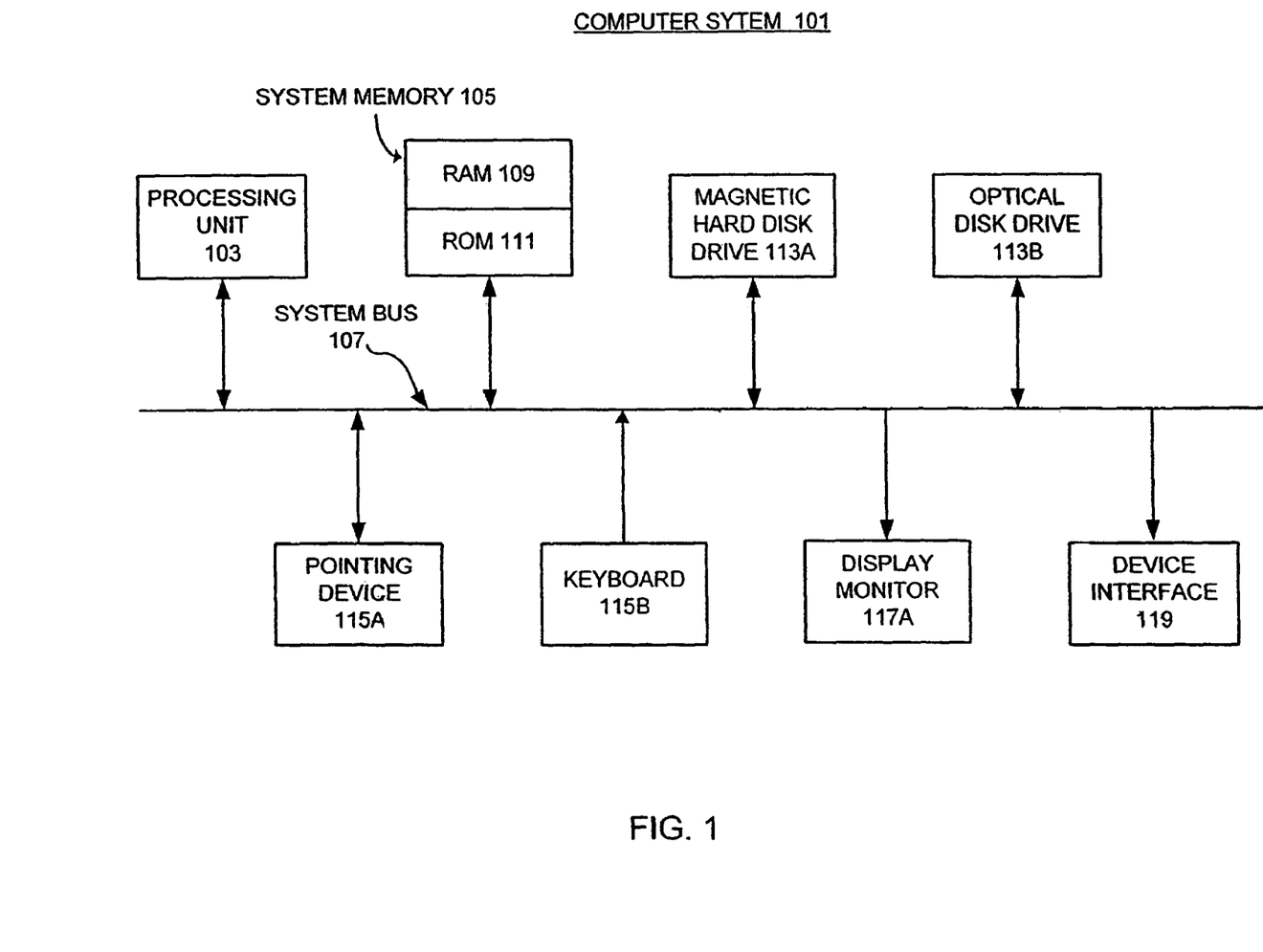
FIG. 1 shows an example of a computing device that may be used to implement a branch merge circuit reduction tool according to various embodiments of the invention.

One or more aspects of a branch merge reduction tool according to various embodiments of the invention may be implemented using electronic hardware. More typically, however, the various features of a branch merge reduction tool according to various embodiments of the invention may be implemented by executing software instructions on a programmable computing device or computer. FIG. 1 shows one example of a computer 101 that can be used to implement a branch merge reduction tool according to the invention.

The computer system 101 illustrated in FIG. 1 includes a processing unit 103, a system memory 105, and a system bus 107 that couples various system components, including the system memory 105, to the processing unit 103. The system memory 105 may include a read-only memory (ROM) 109 and a random access memory (RAM) 111.

The computer 101 may also include one or more memory storage devices 113, input devices 115, and output devices 117. Thus, as shown in FIG. 1, the computer 101 may include a magnetic hard disk drive 113A, an optical disk drive 113B or both. The input devices 115 employed by the computer 101 may then vary depending upon the intended use of the computer 101. For example, if the computer 101 is intended to interact directly with a human user, then the computer 101 may have a pointing device 115A and a keyboard 115B. Similarly, the output devices 117 employed by the computer 101 may also vary depending upon the intended use of the computer 101. Typically, most variations of the computer 101 will have a display monitor 117A. If the computer 101 is intended to interact directly with a human user, then it may alternately or additionally have a printer. Still other memory storage devices 113, input devices 115 and output devices 117 may include "punch" type memory (where physical indentations are made in the memory medium), holographic memory devices, pressure detectors, cameras, scanners, microphones, and vibrational or other motive feedback devices.

As shown in FIG. 1, the computer 101 may additionally has a device interface 119. This device interface 119 may be any type of interface used to obtain data from another device. For example, the device interface 119 may be a conventional connector/port type interface, such as universal serial bus (USB) interface, a Firewire/IEEE 1394 interface, a PS/2 interface, a PC/AT interface, an RS-232 interface, a serial port interface, or an Ethernet port or other telephone-type interface. As will be appreciated by those of ordinary skill in the art, some connector/port type interfaces may have a variety of different configurations.

Still further, if the computer 101 is intended to access other computing devices, it may be capable of operating in a networked environment using logical connections to one or more remote devices, such as other computers. The device interface 119 thus may be connect the computer 101 to one or more remote devices through a local area network (LAN) or a wide area network (WAN), including the Internet. For example, the device interface 119 may be a network interface, such as a wireless or wired network interface card (NIC) or similar device. The device interface 119 may be an internal interface, or it may alternately be an external network interface as is well known in the art. Of course, it will be appreciated that other means of establishing a communications link with other computers may be used.

Branch Merge Reduction Tool

Figure 2:
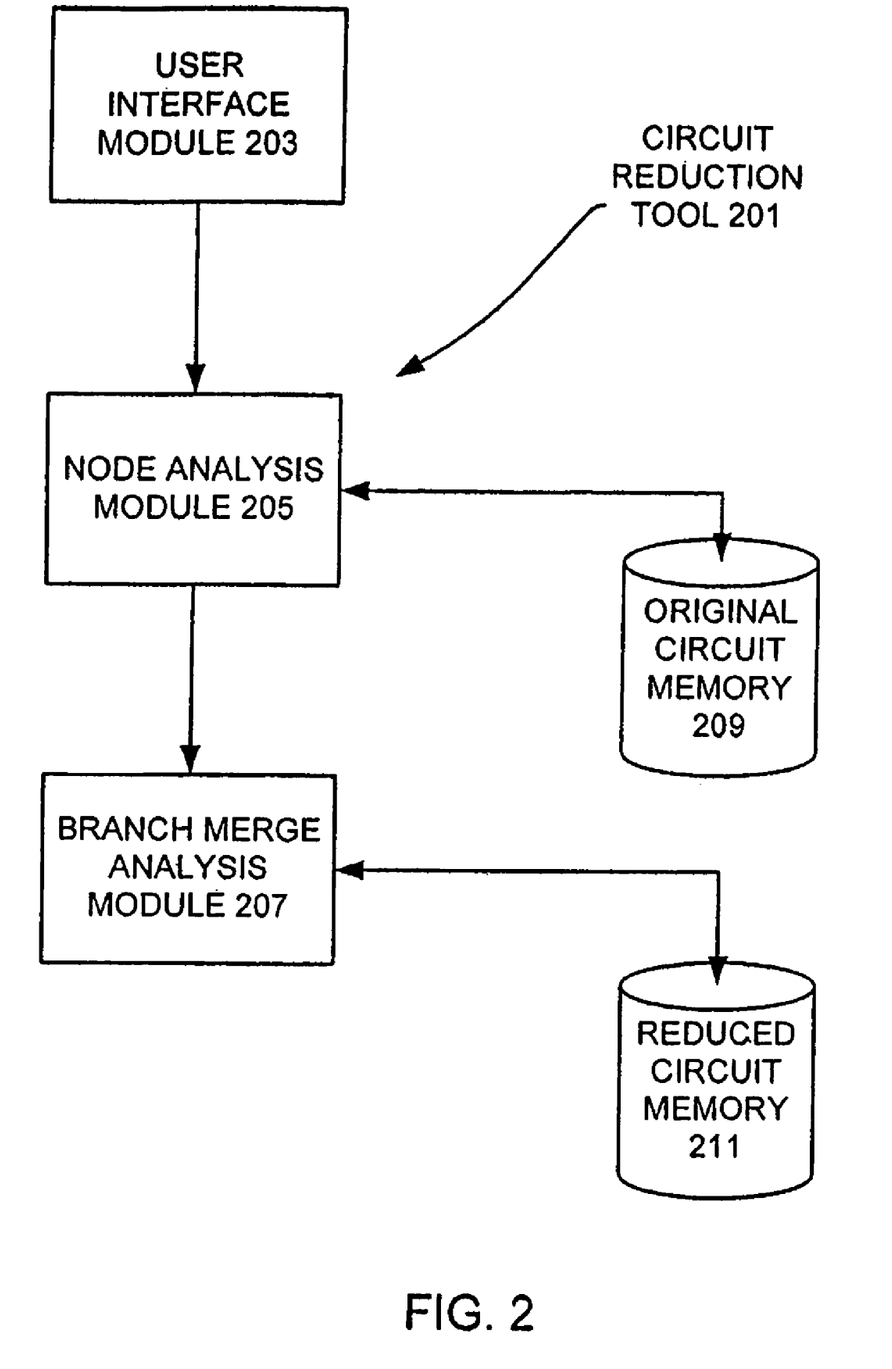
FIG. 2 shows an example of a branch merge circuit reduction tool according to various embodiments of the invention.

FIG. 2 illustrates an example of a branch merge reduction tool 201 that may be implemented on a computing device, such as the computer 101, according to various embodiments of the invention. As seen in this figure, the branch merge reduction tool 201 may include a user interface module 203, a node analysis module 205, and a branch merge analysis module 207. The node analysis module 205 then can retrieve an initial circuit design from the original circuit memory 209, while the branch merge analysis module 207 can save a reduced circuit design in the original circuit memory 209.

As previously noted, one or more of these modules may be implemented by software instructions executing on a programmable computer, such as a personal computer, a mainframe computer, or a collection of two or more computers that are networked together or otherwise in communication with one another. With these embodiments, the instructions may be stored on a medium, such as a solid state memory storage device, a magnetic memory storage device, an optical memory storage device, a punched memory storage device, or any other suitable tangible storage medium. Alternately or additionally, the software instructions may be transmitted from another location. For example, with various embodiments of the invention, the instructions may be transmitted from another computing device or storage location over a hard-wired line, by radio frequency waves, by infrared or other optical waves, or by sonic waves. Still further, various embodiments of the invention may even implement one or more of these modules using analog calculating circuits. Also, with different embodiments of the invention, two or more of these modules may be combined into a single module, or the functions of one or more of these modules may be subdivided into smaller modules. Alternately, various functions for these modules may be rearranged between the modules in any desired manner different from that described in detail below.

Also, while the original circuit memory 209 and the reduced circuit memory 211 are illustrated as being implemented by separate memory device, various embodiments of the invention may implement both the original circuit memory 209 and the reduced circuit memory 211 on a single memory device. The original circuit memory 209 and the reduced circuit memory 211 may be implemented on any readable memory medium, such as a solid state memory storage device, a magnetic memory storage device, an optical memory storage device, a punched memory storage device, or any other suitable tangible storage medium. Alternately or additionally, data stored by the original circuit memory 209 and the reduced circuit memory 211 may be transmitted through another computing device or storage location over a hard-wired line, by radio frequency waves, by infrared or other optical waves, or by sonic waves.

The user interface module 203 can be used to provide relevant data for use during the branch merge process, such as a circuit to be reduced, the maximum frequency at which the circuit can operation, and a schedule of test frequencies that will be applied to analyze each node in the circuit for its merge suitability. As will be discussed in further detail below, the node analysis module 205 determines whether a node in a circuit design is a possible candidate for branch merge reduction. If a node is a possible candidate for branch merge reduction, then the branch merge analysis module 207 analyzes the node to ascertain if merging the branches of the node will still allow the reduced circuit to replicate the timing characteristics of the original circuit with sufficient accuracy. If merging the branches will still allow the desired replication, then the branch merge analysis module 207 will merge the branches of the node to reduce the circuit design.

Branch Merge Reduction

The branch merge reduction process performed by the branch merge analysis module 207 will now be discussed in further detail. Underlying the operation of the branch merge analysis module 207 is the recognition that the amount of reduction that can be imposed on an RLCM network depends on the intended operating range of frequencies. For digital circuits, an approximate operating frequency is $$f^{max} \approx 1/4 t_r^{min} \quad (1)$$

Where $t_r^{min}$ in is the fastest rise/fall time in the system.

Figure 3:
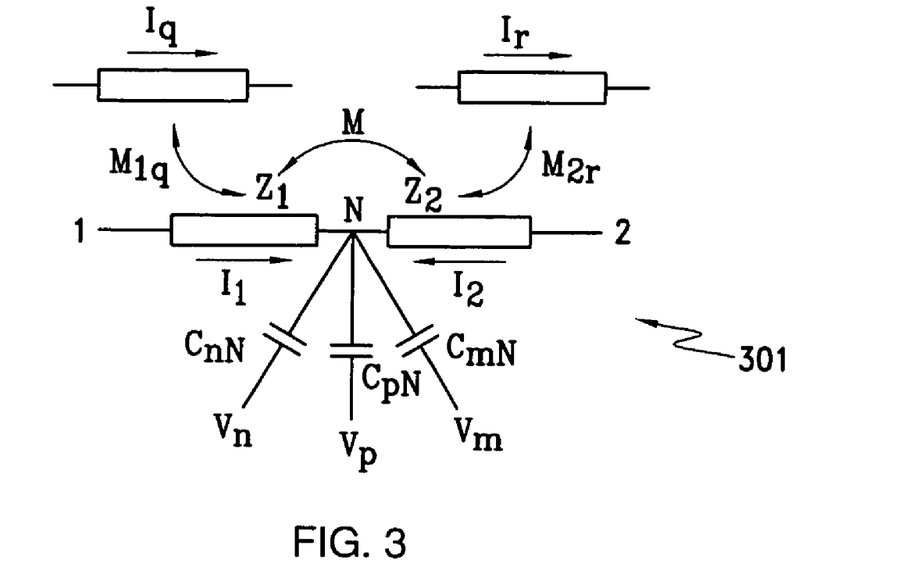
FIG. 3 illustrates an example of an initial circuit.

FIG. 3 illustrates an example of a circuit 301 that may be reduced by branch merging. The circuit 301 can be regarded as part of a much larger network, such as a large circuit design. Path 1-N-2 might be three successive nodes of a clock or bus path, for example. This figure represents the perspective of node N, and only shows those elements that couple to it. The circuit of FIG. 3 thus might be referred to as the "neighborhood" of node N.

As seen in this figure, the neighborhood of the node N has the following elements. First, nodes 1 and 2 are dc connected to node N through impedances $Z_1$ and $Z_2$, which can be described by the formulas:

$$Z_1 = R_1 + sL_1$$

$$Z_2 = R_2 + sL_2 \quad (2)$$

That is, each impedance consists of a resistor and inductor in series. Such branches are referred to as incident RL branches. Second, nodes like $V_n$, $V_p$, ... $V_m$ capacitively couple to node N through capacitors $C_{nN}$, $C_{pN}$, ... $C_{mN}$. These capacitive connections may be referred to as C branches. Finally, there may be branches, such as those carrying currents $I_q$ and $I_r$ in FIG. 3, that couple to node N magnetically, through mutual inductances, to $Z_1$ and $Z_2$. These magnetic connections may be referred to as M branches.

Various embodiments of the invention may perform a branch merge process on nodes having any number of RL branches. With typical embodiments of the invention, however, the branch merge analysis module 207 will only analyze and merge branches for those nodes in a circuit that have exactly two incident RL branches, like node N in FIG. 3. First, this configuration is by far the most common. Second, eliminating nodes with more than 3 incident RL branches may actually increase the circuit's size, rather than reduce it. When such a node is eliminated, a complete clique of branches must be introduced between its former neighbors. Finally, eliminating nodes with incident RL branches of 1 or 3 and higher removes key topological features from the circuit, such as leaves and junctions. Since one benefit of this branch merge reduction process according to various embodiments of the invention is that it can preserve overall topology, it is undesirable to change leaf and junction nodes.

Accordingly, various typical examples of the invention that perform a branch merge process on nodes that have exactly two incident RL branches will now be described for convenience and ease of understanding. From this description of typical embodiments of the invention, it will be apparent to those of ordinary skill in the art how to make and use other embodiments of the invention that perform a branch merge process on nodes that have one or three or more incident RL branches.

Other than having only two incident RL branches for the purposes of this description, the neighborhood of a node that may be processed by these typical embodiments of the invention is arbitrary. A node, such as node N, can have any number of C and M branches, so busses with magnetic and capacitive coupling can be reduced by these embodiments of the invention. In general, it can be assumed that $Z_1$ and $Z_2$ can couple magnetically to each other (see M in FIG. 3). Thus, the circuit 301 shown in FIG. 3 describes a generic circuit for these typical embodiments of the invention that perform a branch merge process on nodes that have exactly two incident RL branches, and these embodiments thus will be described with reference to the generic circuit 301.

Various embodiments for reducing RLCM circuits may repeatedly apply an 'atomic' operation to the generic circuit 301 called a branch merge, which: (1) combines impedances $Z_1$, and $Z_2$ in series, taking into account any mutual M coupling between them; (2) changes the sign of mutual coupling values (e.g., $-M_{2r}$) as necessary in accordance with assumed current directions; and (3) reattaches capacitors that had been connected to node N, such that an appropriate portion of the capacitance is associated with node 1 and an appropriate portion of the capacitance is associated with node 2. This branch merge process thus converts the circuit of FIG. 3 into the reduced circuit 401 illustrated in FIG. 4.

The formula for Z, the impedance of the merged branch, is a direct consequence of the approximation, $$I_1 \approx -I_2 \quad (3)$$

which follows from the assumption that the capacitive current at node N (the current flowing to or from N through incident C branches) is small compared to the currents $I_1$ and $I_2$ flowing through the incident RL branches. This assumption will be discussed in more detail below.

Figure 4:
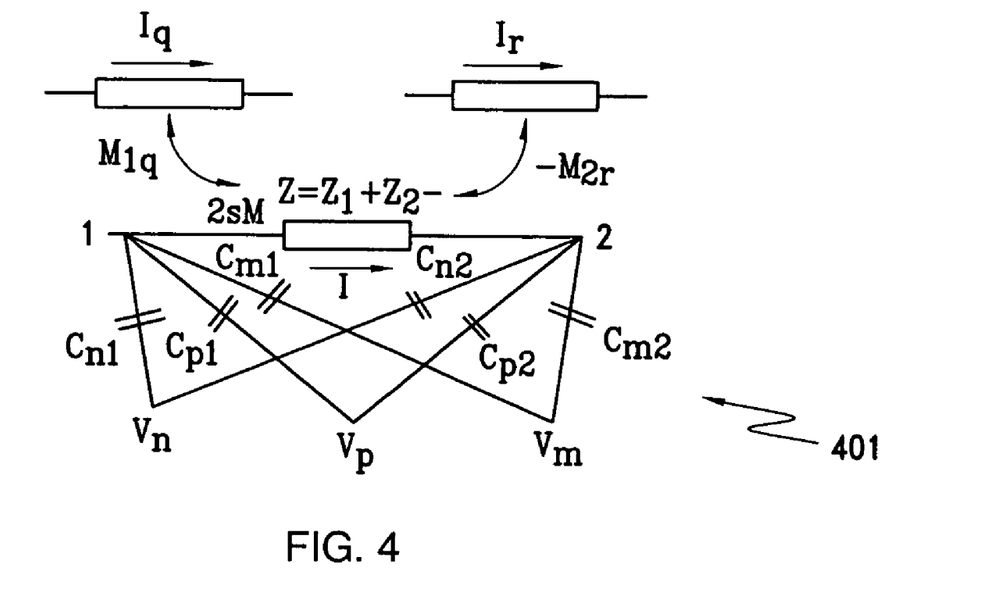
FIG. 4 illustrates an example of a reduced circuit that is formed by merging the branches of the example circuit illustrated in FIG. 3.

Substituting the branch relations $$V_{1N} = (R_1 + sL_1)I_1 + sMI_2 + \Sigma_q sM_{1q}I_q$$

$$V_{2N} = sMI_1 + (R_2 + sL_2)I_2 + \Sigma_r sM_{2r}I_r \quad (4)$$

into $$V_{12} = V_{1N} - V_{2N}. \quad (5)$$

and then replacing $I_1$ by $I$ and $I_2$ by $-I$ provides $$V_{12} = ZI + \Sigma_q sM_{1q}I_q + \Sigma_r (-sM_{2r})I_r, \quad (6)$$

where $$Z = (R_1 + sL_1) + (R_2 + sL_2) - 2sM \quad (7)$$

is the branch impedance and I is the branch current for the circuit 401 shown in FIG. 4.

Equation (6) implies that any M branches coupled to $Z_1$ and $Z_2$ before the merge couple to Z after the merge, the sign being changed if the old and new current directions differ. When $I_1$ and $I_2$ magnetically couple to the same branch, the corresponding terms in $\Sigma_q M_{1q}I_q$ and $\Sigma_r(-M_{2r})I_r$ combine.

In merging capacitors, the net charge stored by C-branch capacitors before and after the branch merge process should be as close to the same as possible. To understand the application of a branch merge operation according to various embodiments of the invention to capacitors, a typical capacitor $C_{pN}$ connecting node p to node N (such as shown in FIG. 3) may be considered. Before transformation, the charge on this capacitor will be $$Q = C_{pN}(V_N - V_{p1}) \quad (8)$$

If the circuit 301 is operating at sufficiently low frequencies, the electromagnetic fields in branches 1 and 2 due to mutual inductances will be small compared to the voltage drops across the resistors. In this example, $$V_N \approx \frac{R_2 V_1 + R_1 V_2}{R_1 + R_2}. \quad (9)$$

Placing this expression into the equation (8) produces $$Q = C_{pN}\left(\frac{R_2 V_1 + R_1 V_2}{R_1 + R_2} - \frac{R_1 + R_2}{R_1 + R_2}V_p\right) \quad (10)$$

$$= \frac{C_{pN}R_2}{R_1 + R_2}(V_1 - V_p) + \frac{C_{pN}R_1}{R_1 + R_2}(V_2 - V_p)$$

for the charge on $C_{pN}$ before the merge. Capacitors $C_{1p}$ and $C_{2p}$ in circuit 401 will store the same charge provided $$C_{p1} = \frac{C_{pN}R_2}{R_1 + R_2}, \; C_{p2} = \frac{C_{pN}R_1}{R_1 + R_2} \quad (11)$$

This is the formula for capacitance splitting; its legitimacy rests on equation (9). An immediate consequence of equation (11) is $$C_{p1} + C_{p2} = C_{pN} \quad (12)$$

That is, the total capacitance is preserved during a capacitor splitting operation. Another consequence is that the operation preserves Elmore delay. Together, equations (6), (7), and (11) define the branch merge operation.

The next consideration is to determine when the branch merge can be applied with little error. As previously noted, a reduced circuit should replicate the timing characteristics of the original circuit over the desired operating frequency range. As will be appreciated by those of ordinary skill in the art, the desired operating frequency is bounded by the maximum operating frequency $f^{max}$, which was defined above in equation (1). Thus, the merger of the branches of a node N is legitimate (i.e., predicate LEGITIMATE(N, $f^{max}$) is true) if and only if the neighborhood circuit before and after a branch-merge at node N has nearly the same currents at neighbor nodes 1 and 2, all other conditions being equal (i.e., when voltages $V_1$, $V_2$, the voltages at the other end of all C branches, and the currents in the M branches are the same when making the comparison).

A number of legitimacy criteria can be employed according to various embodiments of the invention. For example, LEGITIMATE((N, $f^{max}$)=true if the following conditions all hold up to $s = 2\pi i f^{max}$:

(i) $|\hat{Z}_1 Y| \ll 1$ or $|\hat{Z}_2 Y| \ll 1$ \quad (13)

(ii) $|YsM| \ll 1$ (iii) $\dfrac{\hat{Z}_1}{\hat{Z}_1 + \hat{Z}_2} \approx \dfrac{R_1}{R_1 + R_2}$ and $\dfrac{\hat{Z}_2}{\hat{Z}_1 + \hat{Z}_2} \approx \dfrac{R_2}{R_1 + R_2}$ where $$\hat{Z}_1 = R_1 + s(L_1 - M), \; \hat{Z}_2 = R_2 + s(L_2 - M) \quad (14)$$

and $$Y = sC, \; C = \Sigma_p C_{pN} \quad (15)$$

Proof of this legitimacy criteria begins with the modified nodal equations for node N of circuit 301 shown in FIG. 3:

$$\underbrace{\begin{pmatrix} Y & -1 & -1 \\ 1 & Z_1 & sM \\ 1 & sM & Z_2 \end{pmatrix}}_{A} \begin{pmatrix} V_N \\ I_1 \\ I_2 \end{pmatrix} = \begin{pmatrix} \sum_p sC_{pN}V_p \\ V_1 - \sum_q sM_{1q}I_q \\ V_2 - \sum_r sM_{2r}I_r \end{pmatrix} = \begin{pmatrix} YV_C \\ V_1 - V_{1M} \\ V_2 - V_{2M} \end{pmatrix} \quad (16)$$

For brevity, $V_C$ can be set to $$V_C = \frac{\sum C_{pN} V_p}{\sum C_{pN}}, \quad V_{1M} = -\sum s M_{1q} I_q, \quad V_{2M} = -\sum s M_{2r} I_r, \quad (17)$$

and Y is defined by equation (15).

As required by the 'all other conditions equal' clause in the definition of legitimacy, $V_1$ and $V_2$, all M branch currents, and far-node voltages on C branches can be treated as known values. It can be assumed that the conditions of equation (13) of the legitimacy criteria hold, and, for definiteness, that $|\hat{Z}_1 Y| \ll 1$. The determinant of the coefficient matrix in equation (16), $|A|$, should be considered first, for this quantity sets the poles and hence the dynamics of node N. It is straightforward to show that $$|A| = (\hat{Z}_1 + \hat{Z}_2)(1 + YsM) + \hat{Z}_1 \hat{Z}_2 Y, \quad (18)$$

$\hat{Z}_1 + \hat{Z}_2$ being defined in equation (14). If parts (i) and (ii) of equation (13) are true, then $$|A| = \hat{Z}_1(1 + YsM) + \hat{Z}_2(1 + YsM + \hat{Z}_1 Y) \approx \hat{Z}_1 + \hat{Z}_2 = Z \quad (19)$$

quantities small compared to 1 being neglected in the final step. If equation (13) holds, the dynamics of the node are largely determined by Z, the impedance of the merged branch.

Considering next the current flowing at node 1, by the definition of legitimacy defined above, the net current at node 1 should be equal, or nearly equal, for the initial circuit 301 shown in FIG. 3 and the reduced circuit 401 of FIG. 4. Solving equation (16) for $I_1$ of initial circuit 301 shown in FIG. 3, produces, after manipulation, $$I_1 = \frac{1}{|A|} \{(V_1 + V_{1M} - V_2 - V_{2M}) + \quad (20)$$
$$Y \hat{Z}_2 (V_1 - V_C) + Y \hat{Z}_2 V_{1M} + YsM(V_1 + V_{1M} - V_2 - V_{2M})\}$$

Where $(V_1 + V_{1M} - V_2 - V_{2M})$ is the current I in branch Z of the circuit 401, $Y\hat{Z}_2(V_1 - V_C)$ is the current in the C branches connected to node 1 in circuit 401, $Y\hat{Z}_2 V_{1M}$ is not included in the branch-merged circuit 401, and $YsM(V_1 + V_{1M} - V_2 - V_{2M})$. A similar expression holds for $I_2$.

More particularly, considering each of the terms in equation (20), with $|A|$ nearly equals Z of circuit 401 in FIG. 4 by equation (19), the first term is substantially I, the current through the merged branch in circuit 401 of FIG. 4. The second term, by part (iii) of equation (13) and equation (19), can be written $$\frac{Y\hat{Z}_2}{|A|}(V_1 - V_C) \approx \frac{YR_2}{R_1 + R_2}(V_1 - V_C) = \sum_p \frac{sC_{pN} R_2}{R_1 + R_2}(V_1 - V_p) \quad (21)$$

use being made of the definitions of Y and $V_C$. Accordingly, this term nearly equals the current in the displaced capacitors of circuit 401 in FIG. 4 (i.e., the capacitors that have been moved from node N to node 1 as part of the branch merge). The forth term in equation (20) is small compared to the first, according to part (ii) of equation (13), and so may be neglected.

This leaves only the term $Y\hat{Z}_2 V_{1M}$ to be accounted for in equation (20). This term also is negligible; for either $|\hat{Z}_1 Y| \ll 1$ or $|\hat{Z}_2 Y| \ll 1$ (or both), according to part (1) of equation (13). If $|\hat{Z}_2 Y| \ll 1$, then term $Y\hat{Z}_2 V_{1M}$, which has term $\hat{Z}_2 Y$ as a factor, is negligible compared to the contribution of $V_{1M}$ in the term $(V_1 + V_{1M} - V_2 - V_{2M})$. If $|\hat{Z}_1 Y| \ll 1$, then, measured against Y, $R_1$ and $s(L_1 - M)$ are small. That is, branch $Z_1$ models a short piece of metallization, and therefore mutual inductances $M_{1q}$ must also be small (a metal trace cannot have a small self inductance and a large mutual inductance). In other words, $$V_{1M} = \sum_q M_{1q} I_q$$

will tend to be small compared to Y, and $|Y\hat{Z}_2 V_{1M}/|A|| \leq |YV_{1M}| \ll 1$ will almost always hold in practice though it is not a logical necessity.

Two derivative legitimacy criteria that more useful in practice then can be stated in terms of the quantities:

$$\tau_{RC} = \min\{R_1, R_2\} C \quad (22)$$
$$\tau_{LC}^2 = \begin{cases} (L_1 - M)C & \text{if } R_1 < R_2 \\ (L_2 - M)C & \text{if } R_2 < R_1 \end{cases}$$
$$\tau_M^2 = MC$$
$$\tau_{RL} = \max\left\{\frac{L_1 - M}{R_1}, \frac{L_2 - M}{R_2}, \frac{M}{\min\{R_1, R_2\}}\right\}$$
$$\tau_{RL} = \max\left\{\frac{L_1 - M}{R_1}, \frac{L_2 - M}{R_2}, \frac{L_1 - M}{\min\{R_1, R_2\}}\right\}$$

First is the criterion LEGITIMATE (N, $f_{max}$)=true if all the following conditions hold up to $s = 2\pi i f_{max}$:

(i) $|\tau_{RC} s| \ll 1$      (23)

(ii) $|\tau_{LC}^2 s^2| \ll 1$ (iii) $|\tau_M^2 s^2| \ll 1$ (iv) $\frac{R_1}{R_1 + R_2} \approx \frac{L_1 - M}{L_1 + L_2 - 2M}$ For proof of this criterion, it can be shown that equation (23) implies equation (13). For definiteness, is can be assumed that $R_1 = \min\{R_1, R_2\}$. Then $$|\hat{Z}_1 Y| = |R_1 + s(L_1 - M))sC| \leq |\tau_{RC} s| + |\tau_{LC}^2 s^2| \ll 1$$

$$|YsM| = |s^2 MC| \leq |s^2 \tau_M^2| \ll 1$$

Also, part (iv) of equation (23) clearly implies part (iii) of equation (13).

The other legitimacy criterion is LEGITIMATE (N, $f^{max}$)= true if both of the following conditions hold up to $s = 2\pi i f^{max}$:

(i) $|\tau_{RC} s| \ll 1$ (ii) $|\tau_{RL} s| \ll 1$      (24)

Again, this criteria can be shown by equation (24) implying equation (13). Assuming $$|\hat{Z}_1 Y| = |R_1 Cs(1 + s(L_1 - M)/R_1)| \leq |\tau_{RC}s|(1 + |\tau_{RL}s|) \ll 1$$

$$|YsM| = |s^2 CM| = |(sR_1 C)(sM/R_1)| \leq |s\tau_{RC}||s\tau_{RL}| \ll 1$$

$$\frac{\hat{Z}_i}{\hat{Z}_1 + \hat{Z}_2} = \frac{R_i(1 + \varepsilon_i)}{R_1(1 + \varepsilon_1) + R_2(1 + \varepsilon_2)} \approx \frac{R_i}{R_1 + R_2}$$

where $\varepsilon_i = s(L_i - M)/R_i, |\varepsilon_i| 1 \leq |s\tau_{RL}| \ll 1$, i=1, 2.

These legitimacy criteria are both useful in practice, but refer to different situations. The first legitimacy criterion is useful for discretized lines or busses having uniform electrical parameters per unit length. The lines can be low loss with inductance predominating over resistance. The second legitimacy criterion, on the other hand, does not require uniformity but requires (as indicating in part (ii) of equation (24)) that resistive drops be more significant than inductive. It should be appreciated that $\tau_{RC}$ and $\tau_{LC}$ scale with the granularity of the extraction. Thus, smaller R values, C values, and L values result in smaller $\tau_{RC}$ values and $\tau_{LC}$ values. Contrarily, V RL is an intrinsic property of the interconnect technology, independent of how finely the circuit is minced during extraction. To better understand the magnitude of $\tau_{RL}$, a VLSI can be considered with having an interconnect with $$r = 220 \ \Omega/mm, \ Z_0 = 50 \ \Omega, \ t_{pd} = 11 \ ps/mm: \quad (25)$$

$$\tau_{RL} = \frac{l}{r} = \frac{1}{r}\sqrt{\frac{l}{c}}\sqrt{lc} = \frac{Z_0}{r}t_{pd} = \frac{50}{220} 11 \ ps = 2.5 \ ps$$

and, using equation (1), the condition $\pi_{RL} s \ll 1$ becomes $$\frac{2\pi}{4}\tau_{RL} \approx 4 \ ps \ll \tau_r^{min}.$$

As minimum edge rates are usually much slower than 4 ps, part (ii) of equation (24) is likely to hold in practice.

Operation Of The Branch Merge Reduction Tool

Figure 5A:
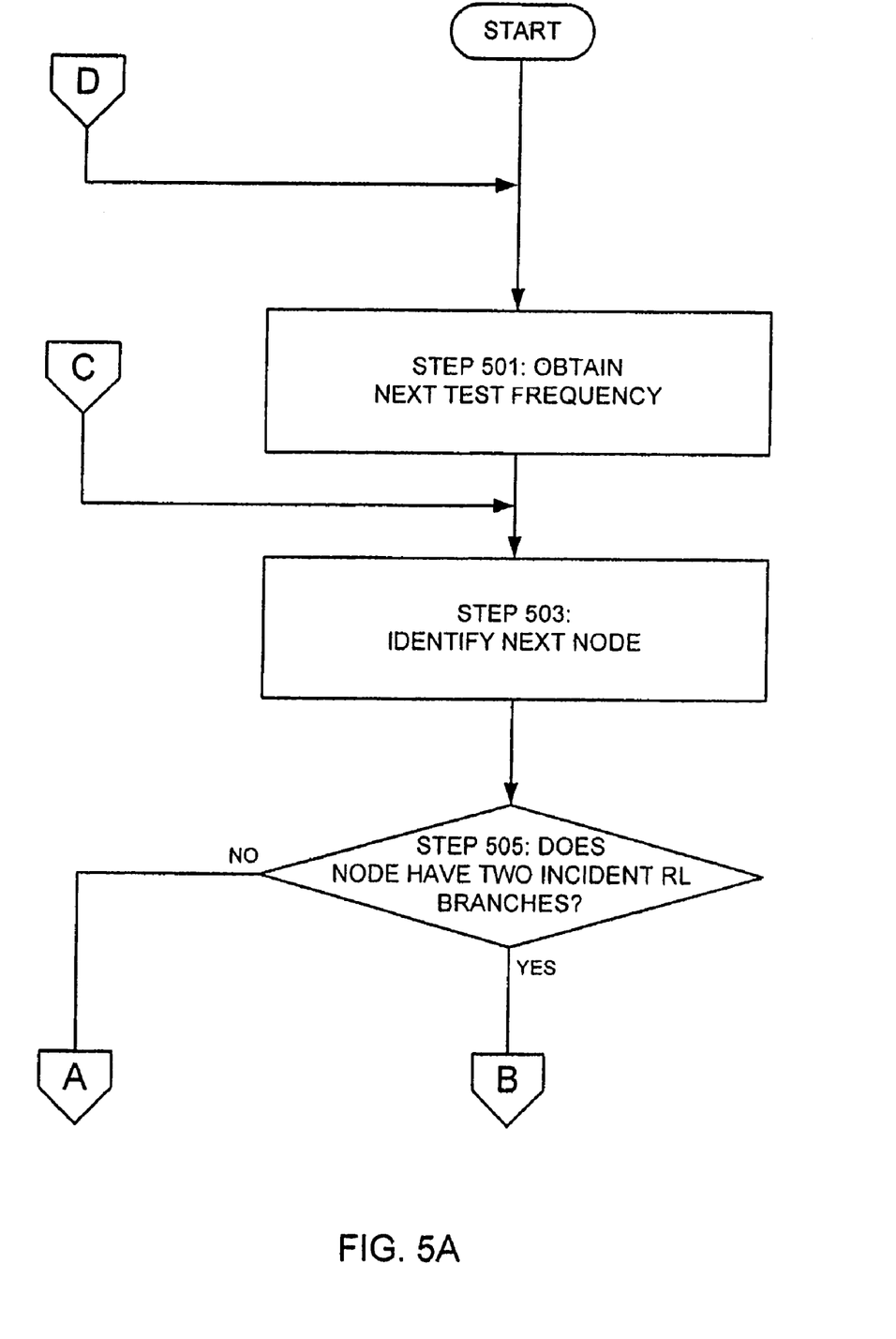
FIGS. 5A and 5B illustrate a branch merge reduction process that may be employed according to various embodiments of the invention.
Figure 5B:
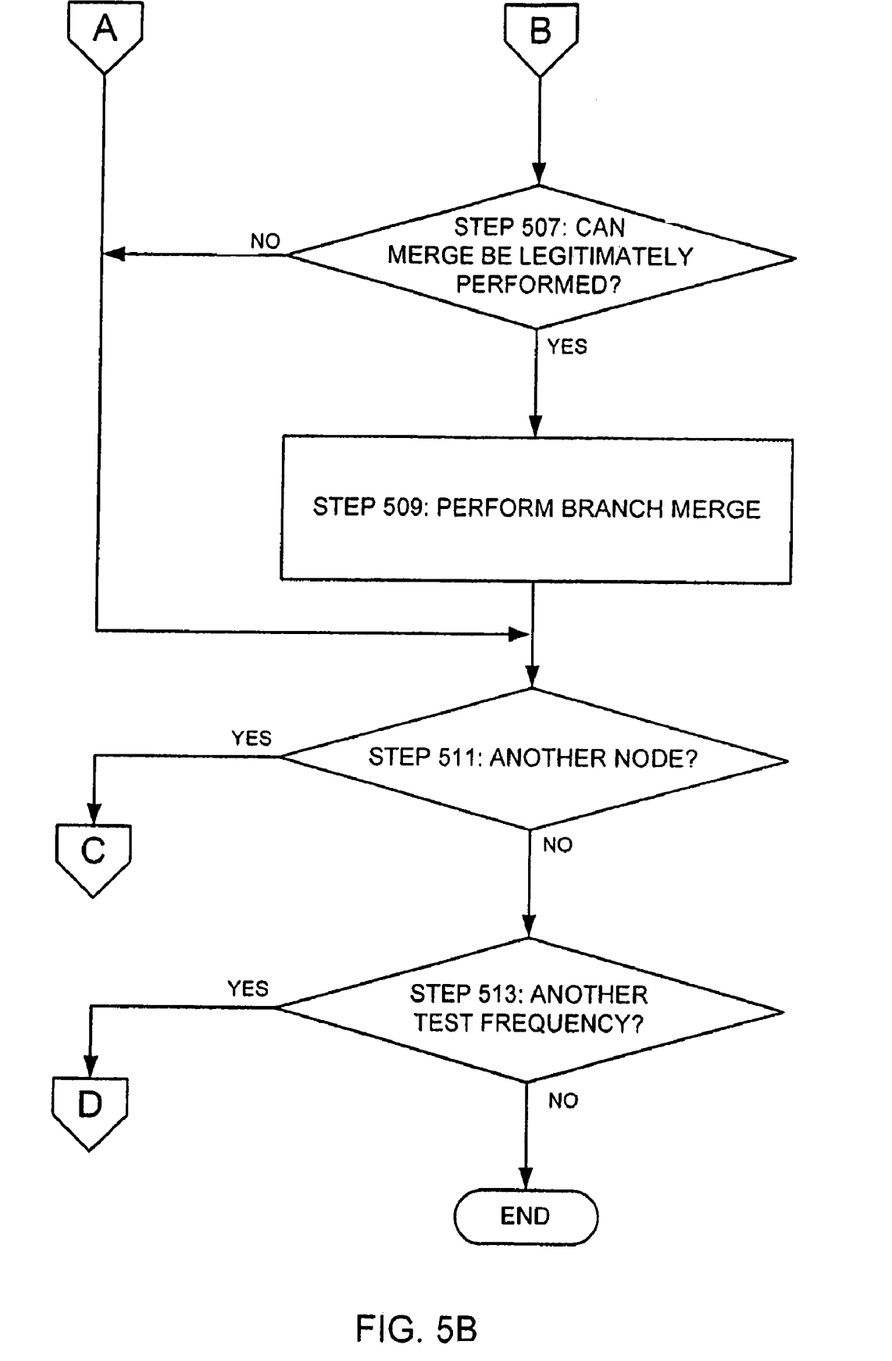

FIGS. 5A and 5B illustrate a branch merge reduction process that may be employed according to various embodiments of the invention. For example, various examples of this process may be employed by the branch merge reduction tool 201 illustrated in FIG. 2. This process makes several passes over a circuit following a schedule of test maximum frequencies. On a given pass, each node in the circuit is visited. If the node has more or fewer than two incident RL branches, the process skips to the next node. IF a node has two incident RL branches, the process checks if a branch merge can be legitimately performed based on the current test maximum frequency using one or more of the legitimacy criterion described above. If so, the process modifies the circuit as described in detail above by performing a branch-merge of the branches of the node.

More particularly, in step 501, the branch merge analysis module 207 obtains the next test maximum frequency that will be employed during the process. With some embodiments of the invention, the schedule of test maximum frequencies may be provided by a user through the user interface module 203. Alternately or additionally, one or more of the test frequencies may be obtained from a memory, such as the original circuit memory 209, the reduced circuit memory 211, or another memory location. A typical schedule of test maximum frequencies may, for example, be generated by multiplying the actual maximum operation frequency by the multipliers[]={10, 5, 2.5, 1.5, 1}. The selection of test maximum frequencies may be made simply to ensure that nodes in the circuit with smaller time constants are eliminated before nodes with larger time constants. Alternately, the node analysis module 207 may maintain a priority queue sorted by nodal time constants and sequence branch-merges by taking from the top of the queue.

Next, the node analysis module 205 identifies the next node in the circuit to be analyzed in step 503. In step 505, the node analysis module 205 determines if the node has exactly two incident RL branches. If it does not, then the process proceeds to step 511, where the node analysis module 205 determines if there is another node in the circuit to be analyzed using the current test maximum frequency. If the node has exactly two incident RL branches, then in step 507 the branch merge analysis module 207 determines whether the branches of the node can be legitimately merged. More particularly, the branch merge analysis module 207 analyzes the node to determine if one or more desired legitimacy criteria described above are met as described in detail above.

As described above, a legitimacy criterion is met when, e.g., the absolute value of one or more time constant values associated with the node were substantially below 1 (i.e., $|\tau| \ll 1$). It should be appreciated, however, that various embodiments of the invention will employ specific threshold values to define the legitimacy of merging the branches of a node. If, for example, the relevant time constant value is above a designate threshold value, then the resulting branch merge will not allow the reduced circuit to replicate the operation of the original circuit with the desired accuracy. If, however, the relevant time constant value is below this threshold value, then the resulting branch merge will allow the reduced circuit to replicate the operation of the original circuit with the desired accuracy. Accordingly, a user can determine the various relevant threshold values based upon the degree of accuracy desired of the reduced circuit. Alternately, as will be discussed in detail below, various embodiments of the invention may employ a relatively large threshold of, e.g., $|\tau| \leq 1$ by employing relatively large test maximum frequencies. Using relatively large text maximum frequencies may allow for significant reduction of the number of nodes in a circuit even with a relatively large threshold of 1.

Next, in step 511, the node analysis module 205 determines if there is another node in the circuit that should be analyzed using the current test maximum frequency. If there is such a node, then the process returns to step 503 and the node analysis module 205 identifies the next node. Otherwise, in step 513, the branch merge analysis module 207 determines if there is another test maximum frequency for which the circuit design should be analyzed. If there is such a test maximum frequency, then the process returns to step 501 with the branch merge analysis module 207 obtaining this next test maximum frequency and the branch merge analysis process being repeated for each remaining node in the circuit. If there are no further test maximum frequencies (i.e., the circuit has been analyzed with respect to all desired test maximum frequencies), then the process is completed. Using this process, if the number of RL, C, and M branches incident on any node is bounded, the complexity of the process is O(n), where n is the number of nodes in the circuit.

EXAMPLES

Figure 6A:
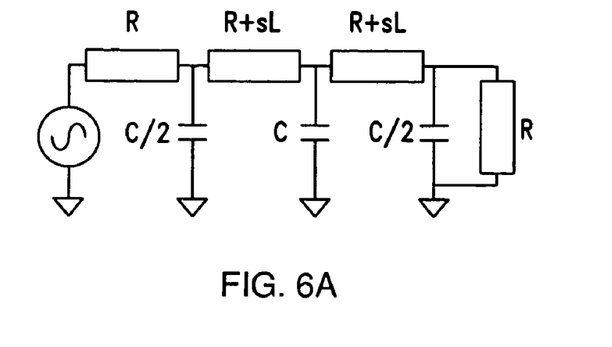
FIG. 6A shows a simple RLC circuit before being reduced by a branch merge process according to various embodiments of the invention.
Figure 6B:
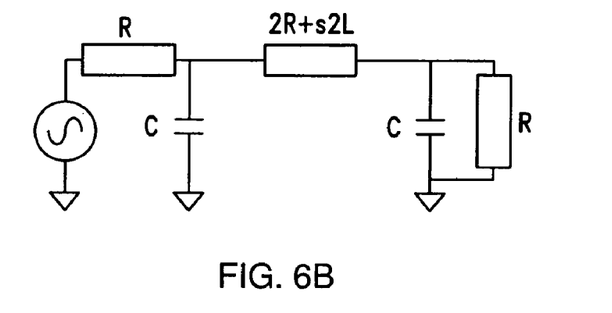
FIG. 6B illustrates the circuit shown in FIG. 6A after being reduced by a branch merge process according to various embodiments of the invention.
Figure 7:
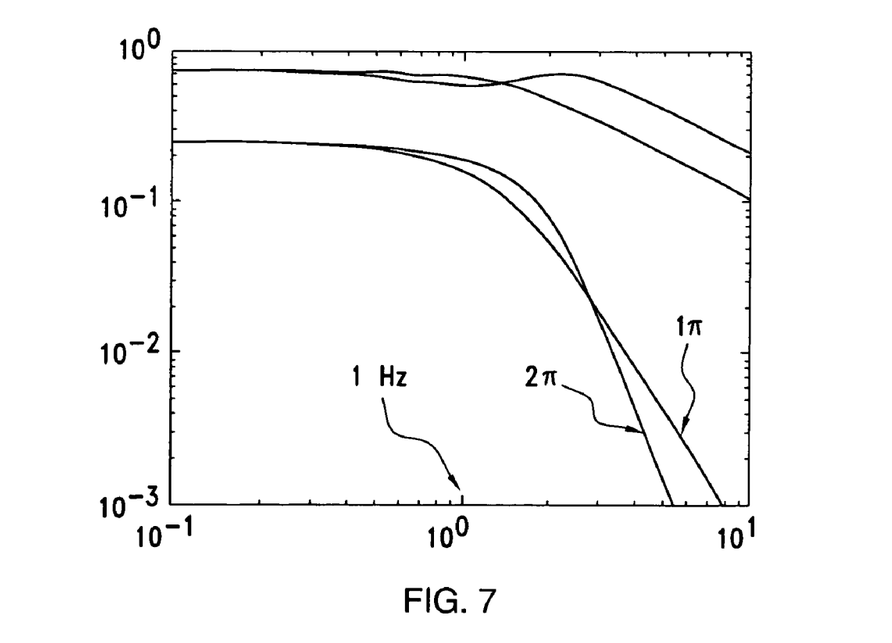
FIG. 7 illustrates a chart showing frequency responses for the circuits shown in FIGS. 6A and 6B.

A first example of an implementation of an embodiment of the invention demonstrates how $\tau_{RC}$ and $\tau_{LC}$ demarcate the operating frequencies beyond which branch-merge should not be performed. FIG. 6A shows a simple RLC circuit before being reduced by a branch merge process according to various embodiments of the invention, while FIG. 6B illustrates the circuit shown in FIG. 6A reduced by a branch merge process according to various embodiments of the invention and after branch merge. For simplicity, R=1 Ω, C=1F, L=1H. FIG. 7 then illustrates a chart showing frequency responses for the circuits shown in FIGS. 6A and 6B.

It can be seen in FIG. 7 that the frequency responses are nearly the same up to about $1/\tau_{RC}$ and $\tau_{LC=1}$ Hz. Beyond this frequency, the 1-π circuit rolls off at 20 dB/decade and the 2-π circuit at 40 dB/decade. This example suggests that equation (23) can be interpreted as a requirement that the circuit operate below the cutoff or resonant frequency of the local mesh.

Figure 8:
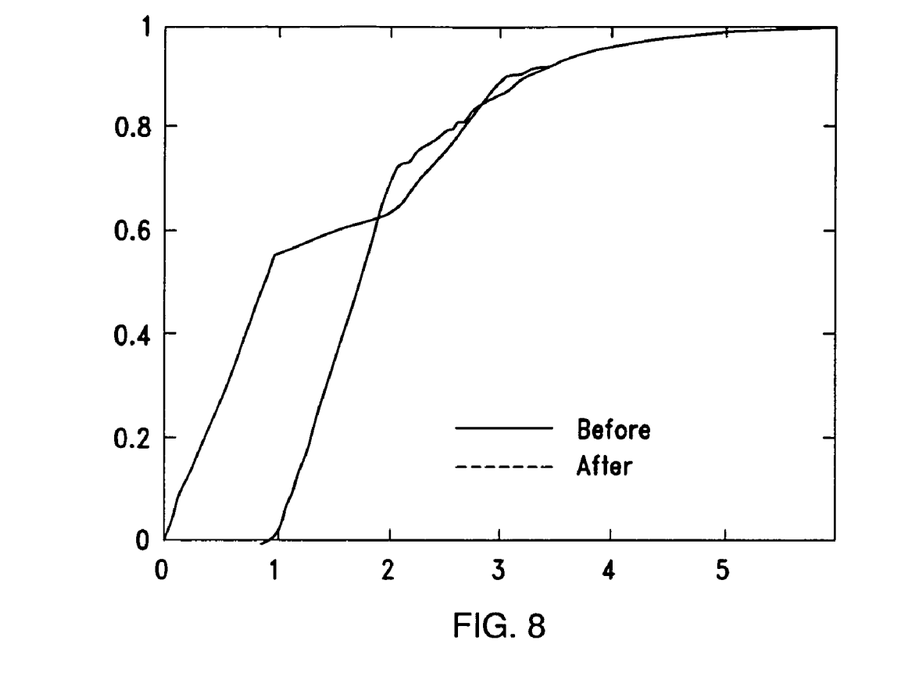
FIG. 8 shows a chart plotting the response of an original circuit of a unit length transmission line with per-unit length parameters R=1 $\Omega$, C=1F, L=1H fractured randomly into 500 sections with each section is modeled as a RLC $\pi$ circuit, and a reduced circuit obtained by applying a branch merge algorithm with $f^{max}=5$ according to various embodiments of the inventions.

A second example is a unit length transmission line with per-unit length parameters R=1 Ω, C=1F, L=1H. The line is fractured randomly into 500 sections, and each section is modeled as a RLC π circuit. FIG. 8 shows a chart plotting the response of the original circuit and the circuit obtained by applying the branch merge algorithm with $f^{max}$325. The near-end and far-end waveforms of the original and reduced circuits are almost identical. Propagation delay due to inductance, evident in the figure, is faithfully replicated by the reduced circuit. This example used a 1 Ω driver with rise time $t_r$=1s. Reduction amounts for this example and the following examples are in Table 1 below.

Figure 9:
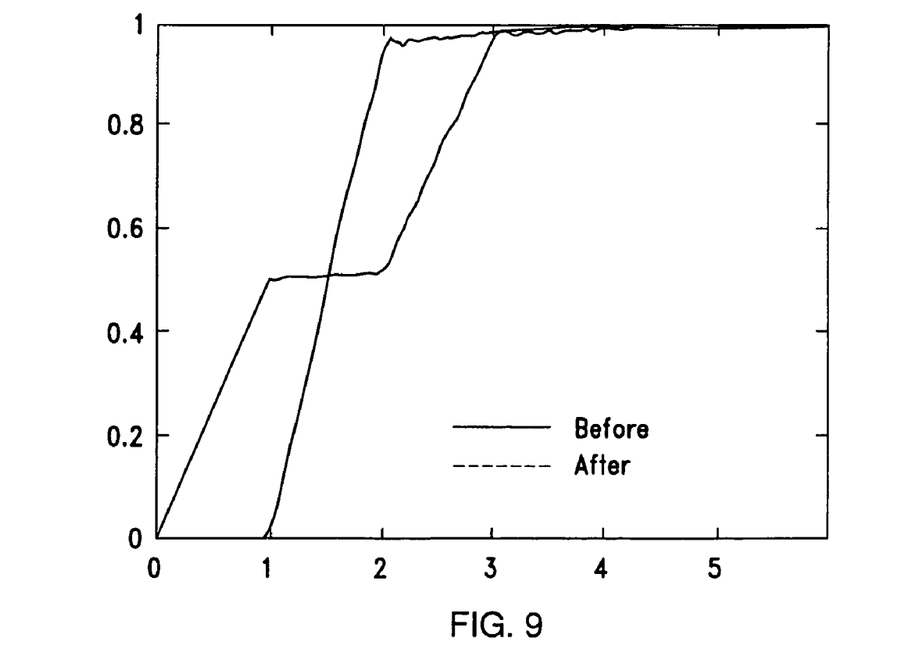
FIG. 9 shows a chart plotting the response of an original circuit of a unit length transmission line with per-unit length parameters R=0.1 $\Omega$, C=1F, L=1H fractured randomly into 500 sections with each section is modeled as a RLC $\pi$ circuit, and a reduced circuit obtained by applying a branch merge algorithm with $f^{max}=5$ according to various embodiments of the inventions.

FIG. 9 gives near and far end waveforms for an identical setup except that R=0.1 Ω/pul instead of 1.0 Ω/pul. For this example, equation (24) does not hold (i.e., $\tau_{RL}s$=10>>1) but equation (23) does. The responses of the original and reduced circuits are again nearly identical, confirming the applicability of the branch merge process according to various embodiments of the invention to low loss transmission lines.

Figure 10:
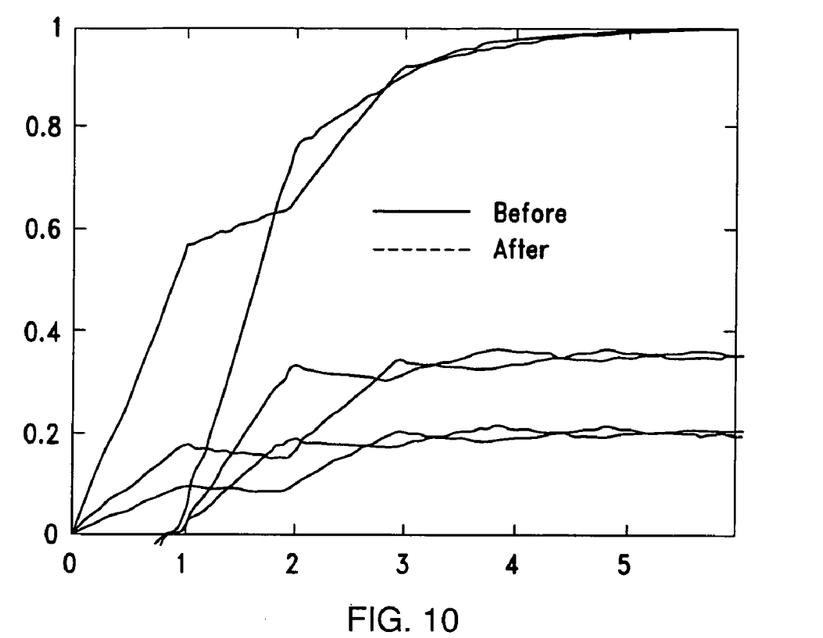
FIG. 10 shows a chart plotting waveforms of an original circuit formed by 3 traces of a bus, one of which is driven, modeled by 200 equal-length coupled $\pi$ sections, and a reduced circuit obtained by applying a branch merge algorithm with $f^{max}=5$ according to various embodiments of the inventions.

To indicate the effectiveness of the branch-merge process according to various embodiments of the invention when applied to coupled lines, FIG. 10 shows a chart plotting waveforms for an initial circuit formed by 3 traces of a bus, one of which is driven. The bus is modeled by 200 equal-length coupled π sections. This chart also shows the waveforms for a reduced circuit obtained by applying a branch-merge process according to various embodiments of the invention with $f^{max}$=5. As seen in this figure, the original and reduced responses agree closely both for victims and aggressor.

Figure 11:
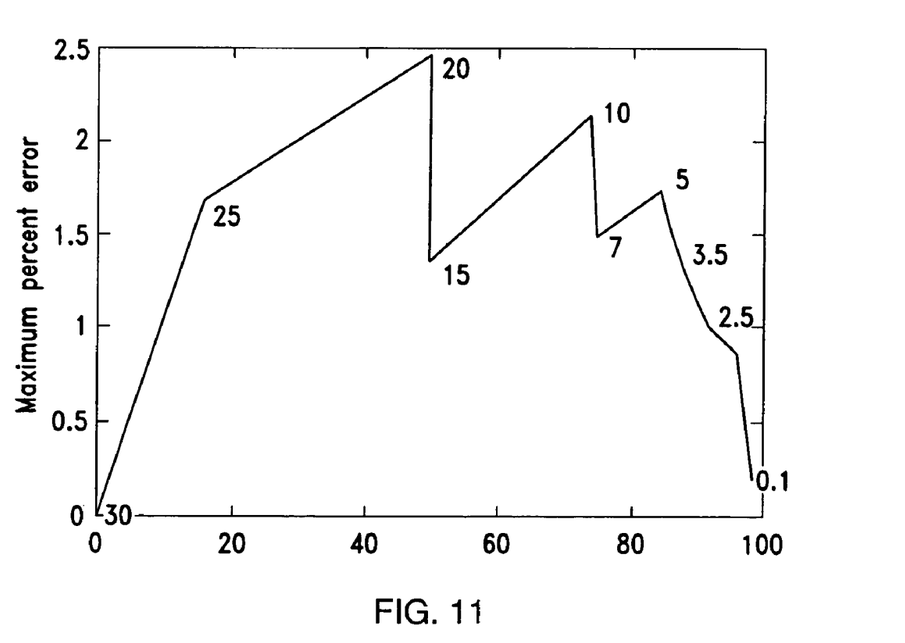
FIG. 11 then shows the results of reducing the same type of coupled 3 line bus employed to create FIG. 10 by applying a branch merge algorithm according to various embodiments of the inventions multiple times using different values of $f^{max}$.

FIG. 11 then shows the results of reducing the same coupled 3 line bus (i.e, the circuit similar to the circuit employed to generate the chart of FIG. 10) multiple times using different values of $f^{max}$. The abscissa is the percentage reduction in node count and the ordinate is the maximum percentage error in the response voltage when the reduced circuit is simulated with a driver rise time $$t_r = CF/4f^{max} \quad (26)$$

For this figure, the constant CF, referred to as the conservation factor because it measures the degree of conservatism in the reduction, is set at 20. The numbers annotating points in the chart are the values of $f^{max}$ used in the corresponding reduction. A key point illustrated by FIG. 11 is that the reduction amount depends on the intended operating frequency.

FIG. 11 is typical. One can have arbitrary reduction amounts by making $f^{max}$ small enough, and the reduced circuit still will be accurate provided the driver's rise time t, is related to $f^{max}$ by equation (26). For practical applications, a user may start with a knowledge of the likely $t_r$ for a given technology and then compute from equation (26) a suitable $f^{max}$ to use in reduction. The amount of reduction also, of course, depends on the distribution of nodal time constants in the original circuit.

TABLE 1

Circuit element counts before and after reduction.

| Circuit | | Nodes | Branch Count | | |
|---|---|---|---|---|---|
| | | | RL | C | M |
| FIG. 5 | BEFORE | 501 | 500 | 501 | 0 |
| | AFTER | 13 | 12 | 13 | 0 |
| FIG. 6 | BEFORE | 501 | 500 | 500 | 0 |
| | AFTER | 13 | 12 | 13 | 0 |
| FIG. 7 | BEFORE | 603 | 600 | 1206 | 600 |
| | AFTER | 99 | 96 | 390 | 96 |

Table 1 gives node and element counts before and after reduction for the circuit of FIGS. 8, 9, and 10. In the reductions underlying these figures, as well as in FIG. 11, a node was eliminated if either the criterion set forth in equation (23) or (24) was true. In applying the legitimacy criteria, a compliance condition such as $|\tau_{RC}s|<<1$ was replaced by $\tau_{RC}f^{max}<1$, with the 'much less than' requirement being taken into account by providing the branch merge reduction process with a suitably large $f^{max}$ (e.g. $f^{max}$=5). As previously noted, employing a large test maximum frequency may easily eliminate a significant number of nodes in a circuit even with a relatively large threshold.

In view of the foregoing description, it should be appreciated that various embodiments of the invention provide a technique that is ideal for parasitic extraction tools that must convert RLCM networks with broad; unregulated time constant profiles into compact circuits suitable for efficient and accurate simulation at designated edge-speeds. In particular, the examples described above indicate that a branch merge process according to various embodiments of the invention using the criteria set forth above works well on important practical circuits like low-loss clock lines and busses with significant electric and magnetic coupling. Further, if $f^{max}$ is suitably tied to the circuit-technology's edge-speed, the proposed legitimacy criteria can maintain the accuracy of the reduced circuit to within a few percent of the initial circuit.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:
1. A method of approximating operating characteristics of a circuit, comprising:
(1) obtaining a circuit design from a memory;
(2) for each node in the circuit design,
identifying each branch of the node,
determining if the node has only a first incident RL branch and a second incident RL branch, if the node has only a first incident RL branch and a second incident RL branch, determining if the node and the identified branches of the node meet the criteria of $|\tau_{RC}s|$ being equal to or below a first threshold value, $|\tau^2_{LC}s^2|$ being equal to or below a second threshold value, $|\tau^2_M s^2|$ being equal to or below a third threshold value, and $$\frac{R_1}{R_1 + R_2} \approx \frac{L_1 - M}{L_1 + L_2 - 2M}, \text{ or}$$

$|\tau_{RC}s|$ being equal to or below a fourth threshold value, and $|\tau_{RL}s|$ being equal to or below a fifth threshold value, where s is a designated test maximum frequency, $R_1$ is the resistance of the first incident RL branch, $L_1$ is the inductance of the first incident RL branch, $R_2$ is the resistance of the second incident RL branch, $L_2$ is the inductance of the second incident RL branch, and M is the magnetic coupling between the first incident RL branch and the second incident RL branch, and where $\tau_{RL} = \max\left\{\frac{L_1 - M}{R_1}, \frac{L_2 - M}{R_2}, \frac{M}{\min\{R_1, R_2\}}\right\}$, and where $\tau_{RC} = \min\{R_1, R_2\}C$, and where $\tau^2_{LC} = \begin{cases} (L_1 - M)C & \text{if } R_1 < R_2 \\ (L_2 - M)C & \text{if } R_2 < R_1 \end{cases}$, and where $\tau^2_M = MC$, where C is the summation of all capacitors sharing a termination at the node; and if the node and the identified branches meet either criteria and if it is determined that the node has only a first incident RL branch and a second incident RL branch, merging the identified branches to eliminate the node, and otherwise not merging the identified branches; and modifying the circuit design to include the merger of the identified branches; and (3) storing the modified circuit design in a memory.

2. The method recited in claim 1, wherein at least one of the threshold values is one.

3. The method recited in claim 2, wherein each of the threshold values is one.

4. The method recited in claim 1, further comprising repeating step (2) for each of a plurality of different maximum test frequencies.

5. A tangible computer-readable storage medium storing computer-executable instructions that when executed by a processor, perform a method comprising:

(1) obtaining a circuit design from a memory;

(2) for each node in the circuit design, identifying each branch of the node, determining if the node has only a first incident RL branch and a second incident RL branch, if the node has only a first incident RL branch and a second incident RL branch, determining if the node and the identified branches of the node meet the criteria of $|\tau_{RC}s|$ being equal to or below a first threshold value, $|\tau^2_{LC}s^2|$ being equal to or below a second threshold value, $|\tau^2_M s^2|$ being equal to or below a third threshold value, and $$\frac{R_1}{R_1 + R_2} \approx \frac{L_1 - M}{L_1 + L_2 - 2M}, \text{ or}$$

$|\tau_{RC}s|$ being equal to or below a fourth threshold value, and $|\tau_{RL}s|$ being equal to or below a fifth threshold value, where s is a designated test maximum frequency, $R_1$ is the resistance of the first incident RL branch, $L_1$ is the inductance of the first incident RL branch, $R_2$ is the resistance of the second incident RL branch, $L_2$ is the inductance of the second incident RL branch, and M is the magnetic coupling between first incident RL branch and a second incident RL branch, and where $\tau_{RL} = \max\left\{\frac{L_1 - M}{R_1}, \frac{L_2 - M}{R_2}, \frac{M}{\min\{R_1, R_2\}}\right\}$, and where $\tau_{RC} = \min\{R_1, R_2\}C$, and where $\tau^2_{LC} = \begin{cases} (L_1 - M)C & \text{if } R_1 < R_2 \\ (L_2 - M)C & \text{if } R_2 < R_1 \end{cases}$, and where $\tau^2_M = MC$, where C is the summation of all capacitors sharing a termination at the node; and if the node and the identified branches meet either criteria and if it is determined that the node has only a first incident RL branch and a second incident RL branch, merging the identified branches to eliminate the node, and otherwise not merging the identified branches; and modifying the circuit design to include the merger of the identified branches; and (3) storing the modified circuit design in a memory.

6. A method of approximating operating characteristics of a circuit, comprising:

(1) obtaining a circuit design from a memory;

(2) for each node in the circuit design, identifying each branch of the node, determining if the node has only a first incident RL branch and a second incident RL branch, responsive to determining that the node fails to have only a first incident RL branch and a second incident RL branch without any other incident RL branches, proceeding to a next node when at least one next node exists that has not been analyzed to determine if the next node has only a first incident RL branch and a second incident RL branch without any other incident RL branches;

responsive to determining that the node has only a first incident RL branch and a second incident RL branch without any other incident RL branches, determining if the node and the identified branches of the node meet the criteria of:

$|_{RC}s|$ being equal to or below a first threshold value, $|\tau^2_{LC}s^2|$ being equal to or below a second threshold value, $|\tau^2_M s^2|$ being equal to or below a third threshold value, and $$\frac{R_1}{R_1+R_2} \approx \frac{L_1-M}{L_1+L_2-2M}, \text{ or}$$

$|\tau_{RC}s|$ being equal to or below a fourth threshold value, and $|\tau_{RL}s|$ being equal to or below a fifth threshold value, where s is a designated test maximum frequency, $R_1$ is the resistance of the first incident RL branch, $L_1$ is the inductance of the first incident RL branch, $R_2$ is the resistance of the second incident RL branch, $L_2$ is the inductance of the second incident RL branch, and M is the magnetic coupling between first incident RL branch and a second incident RL branch, and where $\tau_{RL} = \max\left\{\frac{L_1-M}{R_1}, \frac{L_2-M}{R_2}, \frac{M}{\min\{R_1,R_2\}}\right\}$, and where $\tau_{RC} = \min\{R_1, R_2\}C$, and where $\tau_{LC}^2 = \begin{cases} (L_1-M)C & \text{if } R_1 < R_2 \\ (L_2-M)C & \text{if } R_2 < R_1 \end{cases}$, and where $\tau_M^2 = MC$, where C is the summation of all capacitors sharing a termination at the node; and if the node and the identified branches meet either criteria and if it is determined that the node has only a first incident RL branch and a second incident RL branch, merging the identified branches to eliminate the node, and otherwise not merging the identified branches; and modifying the circuit design to include the merger of the identified branches; and (3) storing the modified circuit design in a memory.

7. The method of claim 1, wherein the designated test maximum frequency s is applied recursively over multiples of an actual maximum operation frequency.

8. The tangible computer-readable storage medium of claim 5, wherein the designated test maximum frequency s is applied recursively over multiples of an actual maximum operation frequency.

9. The method of claim 6, wherein the designated test maximum frequency s is applied recursively over multiples of an actual maximum operation frequency.

\* \* \* \* \*

UNITED STATES PATENT AND TRADEMARK OFFICE
CERTIFICATE OF CORRECTION

PATENT NO. : 7,774,174 B2
APPLICATION NO. : 11/102596
DATED : August 10, 2010
INVENTOR(S) : Bernard N. Sheehan Page 1 of 1

It is certified that error appears in the above-identified patent and that said Letters Patent is hereby corrected as shown below:

Column 16, Claim 6, Line 64:

Please delete " $\left|_{RC}s\right|$ ," and insert -- $\left|\tau_{RC}s\right|$ --.

Signed and Sealed this
Eighth Day of March, 2011

David J. Kappos
*Director of the United States Patent and Trademark Office*